United States Patent [19]
Rector et al.

[11] Patent Number: 5,996,418
[45] Date of Patent: Dec. 7, 1999

[54] LAMINATED PRESSURE SENSING DEVICE

[75] Inventors: Stephen W. Rector, Metamora, Ill.; Robert R. Siegler, Berlin, Conn.

[73] Assignee: Caterpillar Inc., Peoria, Ill.

[21] Appl. No.: 08/996,560

[22] Filed: Dec. 23, 1997

[51] Int. Cl.$^6$ .................. G01L 9/00; G01L 9/08
[52] U.S. Cl. .................. 73/702; 73/753; 310/338; 257/417
[58] Field of Search .................. 73/702, 717–728, 73/753, 754, 756; 310/338; 257/417

[56] References Cited

U.S. PATENT DOCUMENTS

| | | | |
|---|---|---|---|
| 5,285,690 | 2/1994 | Koen et al. | 73/727 |
| 5,604,372 | 2/1997 | Yamaguchi | 257/417 |

*Primary Examiner*—Joseph L. Felber
*Attorney, Agent, or Firm*—Mario J. Donato

[57] ABSTRACT

The present invention provides a pressure sensing device for sensing pressure which is adapted to provide an electrical indication of a sensed pressure. The pressure sensing device has a top lamination, a middle lamination, and a bottom lamination. A pressure sensor is located within an aperture defined in the middle lamination. First and a second electrical connectors, being exposed by the aperture, make electrical connection with the pressure sensor when pressure or compression is applied to the pressure sensing device. An output electrical signal indicative of the applied pressure is produced when the pressure sensor has electrical contact with the electrical conductors.

23 Claims, 2 Drawing Sheets

FIG_2.
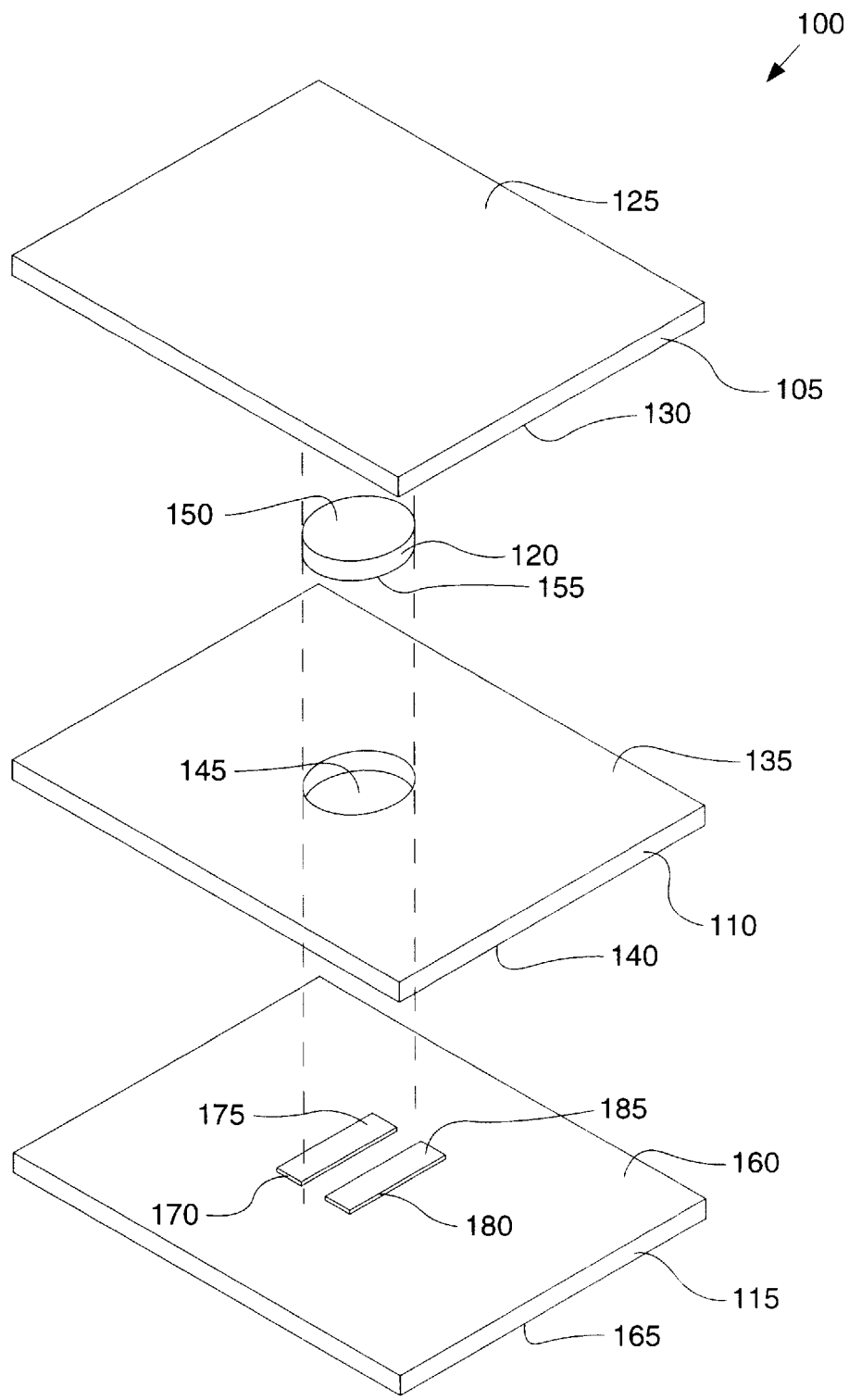

LAMINATED PRESSURE SENSING DEVICE

TECHNICAL FIELD

This invention relates generally to an apparatus for sensing pressure which is adapted to provide an electrical indication of a sensed pressure and more particularly to an apparatus for sensing pressure having at least one of a plurality of laminations

BACKGROUND ART

As is well known in the art, some types of pressure sensor devices are configured to develop an electric potential proportional to an applied pressure. Several forms of these pressure sensors are packaged into pressure sensor devices designed for surface mounting to circuit boards. Typically, the pressure sensor devices are connected to the circuit board by a clamping device.

In order to measure the electric potential in the pressure sensor device, at least two electrical conductors connected to the pressure sensor device will be needed. One type of pressure sensor device requires an electrical conductor to be connected on each side of the pressure sensor. Another type of pressure sensor device requires an electrical conductor to be connected on one side of the pressure sensor. The electrical conductors are usually connected by soldering, glueing or clamping wires to the pressure sensor device.

However, problems may occur when the circuit board is subjected to vibrations or environmental conditions, such as moisture. The vibrations may cause the wires to suffer fatigue and break. The clamping device may also suffer fatigue and dislocate from the circuit board, due to the vibrations. Additionally, pressure sensor devices usually need to remain dry in order to operate properly. The clamping devices will not ordinarily keep moisture off the pressure sensor device.

Since, additional steps are typically required to surface mount pressure sensor devices, the production costs for circuit boards generally increases. Additionally, the clamping device increases the number of components required to produce the circuit board, which potentially increases the overall cost of the circuit board.

The present invention is directed to overcoming one or more of the problems as set forth above.

DISCLOSURE OF THE INVENTION

In one aspect of the present invention, an apparatus for sensing pressure being applied to a circuit board is disclosed. The apparatus for sensing pressure has a top lamination, a middle lamination, and a bottom lamination. The middle lamination has an aperture defined therein. The top side of the middle lamination is proximal to the bottom side of the top lamination. The bottom lamination top side is proximal to the middle lamination bottom side. A first electrical conductor is located adjacent to the bottom lamination top side. A second electrical conductor is located adjacent to the top lamination bottom side. The first and second electrical conductors have a section exposed by the aperture. A pressure sensor is disposed within the aperture. The bottom side of the pressure sensor is proximal to the first electrical conductor, and the top side of the pressure sensor is proximal to the second electrical conductor.

In a second aspect of the present invention, an apparatus for sensing pressure is applied to a circuit board is disclosed. The apparatus for sensing pressure has a top lamination, a middle lamination, and a bottom lamination. The middle lamination has an aperture defined therein. The top side of the middle lamination is proximal to the bottom side of the top lamination. The bottom lamination top side is proximal to the middle lamination bottom side. A first electrical conductor is located adjacent to the bottom lamination top side. A second electrical conductor is located proximal to the first electrical conductor. The first electrical conductor has a section exposed by the aperture. A pressure sensor is disposed within the aperture. The bottom side of the pressure sensor is proximal to the first and second electrical conductors.

These and other aspects and advantages of the present invention, as defined by the appended claims, will be apparent to those skilled in the art from reading the following specification in conjunction with the drawings and the claims.

BRIEF DESCRIPTION OF THE DRAWINGS

For a better understanding of the invention, reference may be made to the accompanying drawings, in which:

FIG. 2 is an exploded view illustrating an embodiment of the invention.

DESCRIPTION OF A PREFERRED EMBODIMENT OF THE INVENTION

Figure 1:
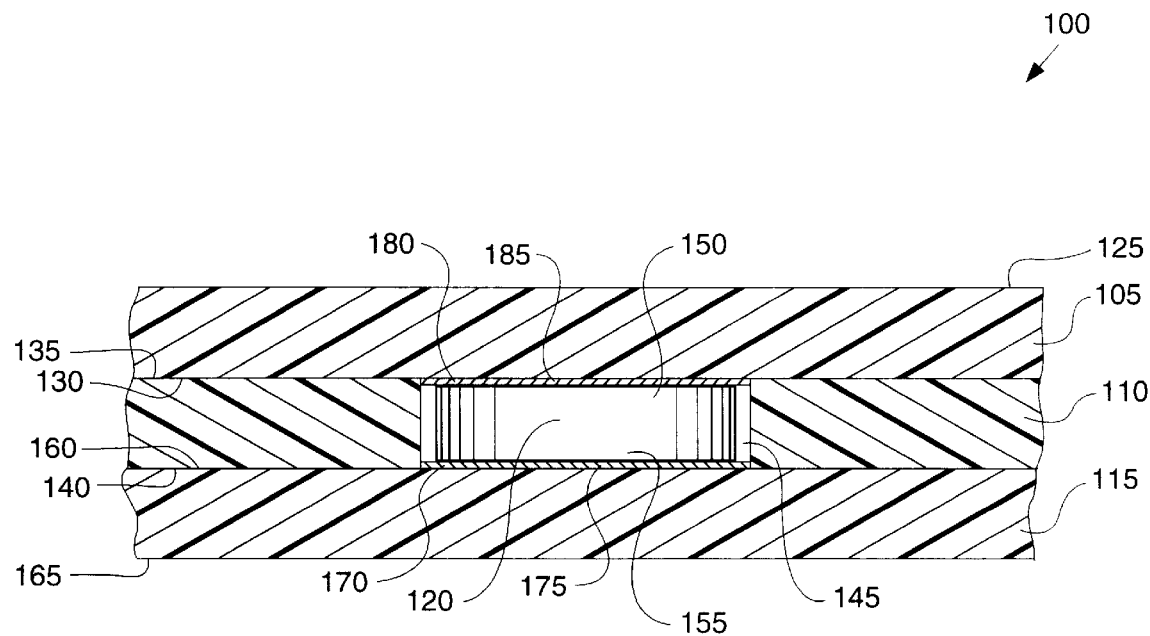
FIG. 1 is a cross sectional view illustrating a preferred embodiment of the invention.

The present invention provides an apparatus for a pressure sensing device. The pressure sensing device, in the preferred embodiment, is incorporated into a circuit board. This invention may be applied to a circuit board including additional circuitry not specific to sensing pressure.

Referring to FIG. 1, a cross sectional view illustrating a preferred embodiment of the pressure sensing device 100 having a top lamination 105, a middle lamination 110, a bottom lamination 115, and a pressure sensor 120, is shown. Each lamination is composed of at least one of a plurality of layers comprising substrates well known in the art for forming circuit boards.

The top lamination 105 has a top side 125 and a bottom side 130. The middle lamination 110 has a top side 135, a bottom side 140, and an aperture 145 defined therein. The middle lamination top side 135 is proximal to the top lamination bottom side 130. The size of the aperture 145 and the size of the pressure sensor 120 are similar. The pressure sensor 120 has a top side 150 and a bottom side 155. In the preferred embodiment, the pressure sensor 120 is a piezoelectric disc type pressure sensor, well known in the art of pressure sensors. Piezoelectric pressure sensors can be fashioned into components of almost any shape and size. In the preferred embodiment, the thickness of the pressure sensor, determined from the distance between the pressure sensor top side 150 and bottom side 155, is analogous to the thickness of the middle lamination, determined from the distance between the middle lamination top side 135 and bottom side 140.

The bottom lamination 115 has a top side 160 and a bottom side 165. The bottom lamination top side 160 is proximal the middle lamination bottom side 140. A first electrical conductor 170 is adjacent to the bottom lamination top side 160. A second electrical conductor 180 is located adjacent to the top lamination bottom side 130. A section 175 of the first electrical conductor 170 is exposed by the aperture 145. A section 185 of the second electrical conductor 180 is also exposed by the aperture 145.

When pressure is applied to the area on the top lamination top side 125 directly above the aperture 145 and to the area on the bottom lamination bottom side 165 directly below the aperture 145, the pressure sensor bottom and top sides 155 and 150 will be in electrical contact with the first and second electrical conductors 170, 180. An output electrical signal indicative of the applied pressure will be produced when the pressure sensor 120 has electrical contact with the first and second electrical conductors 170, 180.

Alternatively, a compressive pre-load may be continuously applied to the pressure sensing device, resulting in an output electrical signal indicative of an increase or a decrease in the compression is applied.

The first and second electrical conductors 170, 180 are configured for the type of pressure sensor 120 requiring an electrical connection on each side. The first and second electrical conductors 170, 180 are electrically connected to a circuit (not shown), configured to deliver and receive electrical signals to and from the pressure sensing device 100.

In the preferred embodiment, the first and second electrical conductors 170, 180 are configured during the manufacturing process of the bottom and top laminations 115 and 105, respectively. As is well known in the art, there are a number of different manufacturing processes used for producing electrical conductors on laminations of the circuit board type. One example is an additive process where plating techniques are employed. Another example is a subtractive process where etching techniques are employed. Although the embodiment is shown with the first and second electrical conductors 170 180 being of a diameter substantially equal to the diameter of the aperture 145, one skilled in the art could readily implement the present invention in connection with the first and second electrical conductors 170, 180 configured smaller or larger than the diameter of the aperture 145.

Referring to FIG. 2, an exploded view illustrating an embodiment of the pressure sensing device 100 is shown. As described above, the pressure sensing device 100 includes a top lamination 105, a middle lamination 110, a bottom lamination 115, and an aperture 145.

A first electrical conductor 170 is located adjacent to the bottom lamination top side 160. A second electrical conductor 180 is located proximal to the first electrical conductor 170. A section 175 of the first electrical conductor 170 is exposed by the aperture 145. A section 185 of the second electrical conductor 180 is also exposed by the aperture 145.

The first and second electrical conductors 170, 180 are configured for the type of pressure sensor 120 requiring both electrical connections to be on one side. As described above, the pressure sensor 120 has a top side 150 and a bottom side 155. In the preferred embodiment, the pressure sensor 120 is a piezoelectric disc type pressure sensor, well known in the art of pressure sensors. Piezoelectric pressure sensors can be fashioned into components of almost any shape and size.

When pressure is applied to the area on the top lamination top side 125 directly above the aperture 145 and to the area on the bottom lamination bottom side 165 directly below the aperture 145, the pressure sensor bottom side 155 will be in electrical contact with the first and second electrical conductors 170, 180. An output electrical signal indicative of the applied pressure will be produced when the pressure sensor 120 has electrical contact with the electrical conductors 170, 180. Alternatively, a compressive pre-load may be continuously applied to the pressure sensing device, resulting in an output electrical signal indicative of an increase or a decrease in the compression being applied. The first and second electrical conductors 170, 180 are electrically connected to a circuit (not shown), such as a controller, configured to deliver and receive electrical signals to and from the pressure sensing device 100.

While aspects of the present invention have been particularly shown and described with reference to the embodiment above, it will be understood by those skilled in the art that various additional embodiments may be contemplated without departing from the spirit and scope of the present invention. For example, the first and second electrical conductor sections 175, 185 may be configured as a protrusion exposed by the aperture. In another example, the electrical conductors 170, 180 may be configured as a layer adjacent the bottom lamination top side 160 and the top lamination bottom side 130, respectively. However, such devices and methods should be understood to fall within the scope of the present invention as determined based upon the claims below and any equivalence thereof.

Industrial Applicability

The pressure sensing device 100 of the present invention operates as follows. As seen in the Figures, the pressure sensing device 100 has a top lamination 105, a middle lamination 110, and a bottom lamination 115, the middle lamination 110 having an aperture 145 defined therein. When pressure is applied to the area on the top lamination 105 located directly above the aperture 145 and to the area on the bottom lamination 115 directly below the aperture 145, a pressure sensor 120 located within the aperture 145 is in electrical contact with first and second electrical conductors 170, 180 exposed by the aperture 145. An electrical signal indicative of a sensed pressure is produced. The electrical conductors 170, 180 are electrically connected to a circuit (not shown) configured to receive the electrical signal from the pressure sensing device 100. Alternatively, a compressive pre-load may be continuously applied to the pressure sensing device, resulting in an output electrical signal indicative of an increase or a decrease in the compression being applied.

Because the pressure sensing device 100 is an integral part of the circuit board, there are no problems with wires connected to the pressure sensing device suffering fatigue or breaking when subjected to vibration. Additionally, the pressure sensor 120 is not exposed to environmental conditions, such as moisture. Furthermore, additional production cost, due to surface mounting the pressure sensing device 100, or the purchase of a clamping device will not be incurred

We claim:

1. An apparatus for sensing pressure being applied to a circuit board, comprising:

a top lamination, the top lamination having a top side and a bottom side, the top lamination operable to deflect when a predetermined pressure is applied to the top side of the top lamination;

a middle lamination, the middle lamination having a top side and a bottom side, the middle lamination top side being proximal to the top lamination bottom side;

a bottom lamination, the bottom lamination having a top side and a bottom side, the bottom lamination top side being proximal to the middle lamination bottom side;

an aperture defined in the middle lamination;

a first electrical conductor adjacent to the bottom lamination top side, the first electrical conductor having a section exposed by the aperture;

a second electrical conductor adjacent to the top lamination bottom side, the second electrical conductor having a section exposed by the aperture; and a pressure sensor, the pressure sensor having a top side and a bottom side, the pressure sensor being within the aperture, the pressure sensor bottom side being electrically coupled with the first electrical conductor, and the pressure sensor top side being electrically coupled with the second electrical conductor, the pressure sensor being operable to detect a predetermined pressure applied to the top of the top lamination as a function of the deflection of the top lamination.

2. The apparatus for sensing pressure as set forth in claim 1 wherein the first electrical conductor protrudes into the aperture.

3. The apparatus for sensing pressure as set forth in claim 1, wherein the second electrical conductor protrudes into the aperture.

4. The apparatus of claim 1 wherein the bottom side of the pressure sensor is in physical contact with the first electrical conductor and the top side of the pressure sensor is in physical contact with the second electrical conductor.

5. The apparatus of claim 1 wherein the middle and bottom laminates jointly form a unified layer.

6. An apparatus for sensing pressure being applied to a circuit board, comprising:
   a top lamination, the top lamination having a top side and a bottom side, the top lamination operable to deflect when a predetermined pressure is applied to the top side of the top lamination;
   a middle lamination, the middle lamination having a top side and a bottom side, the middle lamination top side being proximal to the top lamination bottom side;
   a bottom lamination, the bottom lamination having a top side and a bottom side, the bottom lamination top side being proximal to the middle lamination bottom side;
   an aperture defined in the middle lamination;
   a first electrical conductor adjacent to the bottom lamination top side, the first electrical conductor having a section exposed by the aperture;
   a second electrical conductor being adjacent to one of the bottom lamination top side and the top lamination bottom side, the second electrical conductor having a section exposed by the aperture; and
   a pressure sensor, the pressure sensor having a top side and a bottom side, the pressure sensor being within the aperture, the pressure sensor bottom side being electrically coupled with the first and second electrical conductors the pressure sensor being operable to detect a predetermined pressure applied to the top of the top lamination as a function of the deflection of the top lamination.

7. The apparatus for sensing pressure as set forth in claim 6, wherein the first electrical conductor protrudes into the aperture.

8. The apparatus for sensing pressure as set forth in claim 6, wherein the second electrical conductor protrudes into the aperture.

9. The apparatus of claim 6 wherein the bottom side of the pressure sensor is in physical contact with the first electrical conductor and the top side of the pressure sensor is in physical contact with the second electrical conductor.

10. An apparatus for detecting pressure, comprising:
    a first pliable layer having a first side and a second side, the first layer operable to deflect when a predetermined pressure is applied to the first side of the first layer;
    a second layer having a first side and a second side, the second layer having a recess in the first side, the first side of the second layer being adjacent to the second side of the first pliable layer;
    a first electrical contact;
    a second electrical contact;
    a pressure sensor disposed within the recess, the pressure sensor being physically and electrically coupled with the first and second electrical contacts, and coupled with the first pliable layer without an intervening fluid medium to detect a predetermined pressure applied to the first pliable layer as a function of the deflection of the first pliable layer.

11. The apparatus of claim 10 wherein the recess has a floor and a wall, and the second layer comprises:
    a third layer, at least a part of the third layer forming the floor of the recess; and
    a fourth layer adjacent to the third layer and disposed between the third layer and the first layer, the fourth layer having an aperture that defines the recess, at least a part of the fourth layer forming the wall of the recess.

12. The apparatus of claim 10 wherein the first electrical contact is disposed at least in part in the first pliable layer, and the second electrical contact is disposed at least in part in the second layer.

13. The apparatus of claim 10 wherein the first and second electrical contacts are disposed at least in part in the second layer.

14. The apparatus of claim 10 wherein the pressure sensor has a first side and a second side, and the first side of the pressure sensor is coupled with the first electrical contact and the second side of the pressure sensor is coupled with the second electrical contact.

15. The apparatus of claim 14 wherein the first electrical contact is disposed between the first side of the pressure sensor and at least part of the first pliable layer and the second electrical contact is disposed between the second side of the pressure sensor and at least part of the second layer.

16. The apparatus of claim 10 wherein the pressure sensor has a first side and a second side, and the second side of the pressure sensor is coupled with the first and second electrical contacts.

17. The apparatus of claim 16 wherein the first and second electrical contacts are disposed between the second side of the pressure sensor and at least part of the second layer.

18. The apparatus of claim 10 wherein the first pliable layer is resilient.

19. The apparatus of claim 10 wherein the first and second layers comprise circuit boards.

20. The apparatus of claim 10 wherein the pressure sensor comprises a piezoelectric sensor.

21. A method for forming a laminated pressure sensor, comprising:
    forming a first layer having a recess;
    disposing a pressure sensor in the recess; and
    forming a second layer adjacent to the first layer, the second layer being physically coupled with the pressure sensor and operable to deflect when a predetermined pressure is applied to the second layer, and operable to apply pressure without an intervening fluid medium via the deflection to the pressure sensor, the first and second layers jointly encapsulating the pressure sensor.

22. The method of claim 21, wherein the recess has a floor and a wall, and forming a first layer having a recess comprises:
    forming a third layer, the third layer forming the floor of the recess; and
    forming a fourth layer having an aperture that defines the recess, at least a part of the fourth layer forming the wall of the recess, the fourth layer being physically coupled with and adjacent to the third layer.

23. The method of claim 21 wherein the first and second layers comprise circuit boards.

* * * * *

UNITED STATES PATENT AND TRADEMARK OFFICE
CERTIFICATE OF CORRECTION

PATENT NO. : 5,996,418
DATED : 12/7/99
INVENTOR(S) : Stephen W. Rector and Robert R. Siegler It is certified that error appears in the above-identified patent and that said Letters Patent is hereby corrected as shown below:

Column 5, line 18, delete "laminates" and insert --laminations--

Signed and Sealed this

Twelfth Day of September, 2000

Attest:

Q. TODD DICKINSON

*Attesting Officer*   *Director of Patents and Trademarks*

UNITED STATES PATENT AND TRADEMARK OFFICE
CERTIFICATE OF CORRECTION

PATENT NO. : 5,996,418
DATED : 12/7/99
INVENTOR(S) : Stephen W. Rector and Robert R. Siegler It is certified that error appears in the above-identified patent and that said Letters Patent is hereby corrected as shown below:

In column 1, line 3, please add the following:

--This invention was made with Government support under Agreement No. MDA972-94-3-0015 awarded by ARPA. The Government has certain rights to this invention.--

Signed and Sealed this

Twenty-sixth Day of December, 2000

Attest:

Q. TODD DICKINSON

*Attesting Officer*          *Director of Patents and Trademarks*